(12) United States Patent
Jeon et al.

(10) Patent No.: US 6,865,067 B2
(45) Date of Patent: Mar. 8, 2005

(54) STRUCTURE OF RADIO FREQUENCY VARIABLE CAPACITOR AND METHOD OF MANUFACTURING THE SAME

(75) Inventors: Sang-yoon Jeon, Seoul (KR); Chun-deok Suh, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 9 days.

(21) Appl. No.: 10/701,553

(22) Filed: Nov. 6, 2003

(65) Prior Publication Data

US 2004/0114301 A1 Jun. 17, 2004

(30) Foreign Application Priority Data

Nov. 6, 2002 (KR) .................................. 10-2002-0068574

(51) Int. Cl.[7] ................................................. H01G 4/38
(52) U.S. Cl. ........................ 361/328; 361/303; 257/312
(58) Field of Search ................................ 361/303, 304, 361/328–329, 314, 312, 300; 257/301

(56) References Cited

U.S. PATENT DOCUMENTS 4,003,009 A    1/1977  Watanabe
4,186,350 A  * 1/1980  Takayama ................. 455/193.3
4,769,605 A  * 9/1988  Fox ............................ 324/322
6,278,871 B1   8/2001  Jovenin
6,355,534 B1   3/2002  Cheng et al. ............... 438/379

FOREIGN PATENT DOCUMENTS

EP            0 975 093         1/2000

OTHER PUBLICATIONS

Zurcher, et al, "Integration of Thin Film MIM Capacitors . . . " IEDM Tech.Digest p. 153–6 (Dec. 10, 2000).

* cited by examiner

Primary Examiner—Anthony Dinkins
(74) Attorney, Agent, or Firm—Lee & Sterba, P.C.

(57) ABSTRACT

In a structure of a radio frequency (RF) variable capacitor having a variable range of capacitance between a first minimum value and a first maximum value, and a method of manufacturing the structure, the structure includes a first capacitor, which has a variable range of capacitance between a second minimum value greater than the first minimum value and a second maximum value greater than the first maximum value, and a second capacitor, which is connected in series to the first capacitor and has a capacitance of a fixed value. By the structure and method, a quality factor of a radio frequency (RF) variable capacitor may be increased without adding complex processing steps.

11 Claims, 3 Drawing Sheets

STRUCTURE OF RADIO FREQUENCY VARIABLE CAPACITOR AND METHOD OF MANUFACTURING THE SAME

BACKGROUND OF THE INVENTION

1. Field of the Invention

The present invention relates to a variable capacitor. More particularly, the present invention relates to a structure of a radio frequency variable capacitor to improve a quality factor while using a CMOS process, and a method of manufacturing the same.

2. Description of the Related Art

In a mobile communication system, a radio frequency (RF) block is designed to support many frequency bandwidths. In particular, a variable capacitor having a different capacitance for each frequency bandwidth should be used as a capacitor used in a filter having a direct relation to a frequency bandwidth. In addition, a voltage controlled oscillator (VCO), which is one element in an RF block, adjusts a voltage applied to a variable capacitor to vary the capacitance thereof, and changes a resonance frequency thereby. In this way, the variable capacitor is a very important device for a tunable filter or a VCO for the RF block.

Meanwhile, according to a recent trend in mobile communication systems, an RF IC using a silicon process technology has been developed, and problems that are now being faced in designing the RF IC are proper modeling of a passive element at a frequency bandwidth of several tens of GHz. In particular, it is difficult to integrate a VCO using a passive element such as an inductor or a variable capacitor. That is, if the passive element is used at an RF bandwidth of several tens of GHz, a quality factor is reduced, and as a frequency increases, losses caused by a coupling effect and a skin effect with a substrate increase.

In order to solve this problem, the prior art discloses a method of implementing a variable capacitor using a microelectromechanical system (MEMS) technology. The MEMS variable capacitor uses the air as a dielectric body and thus has a high quality factor, a wide range of tuning, and an ability to be easily compensated for process or temperature variations. In addition, the MEMS variable capacitor has low phase noise, very low insertion loss and small power consumption. As such, the MEMS variable capacitor may be used in a tunable filter requiring a wide dynamic range and a VCO requiring low phase noise.

However, in spite of its advantages, the MEMS variable capacitor has a tuning voltage from at least 5V to several tens of V. Thus, it is very difficult to use the MEMS variable capacitor in an existing low power consumption element, in particular, a low voltage operating system for a CMOS and an RF communication device. Further, an additional process is required to integrate the MEMS variable capacitor into a CMOS RF IC, thereby increasing costs.

SUMMARY OF THE INVENTION

The present invention provides a structure of a radio frequency (RF) variable capacitor to improve a quality factor while using a CMOS process by reducing an internal parasitic resistance component.

The present invention also provides a method of manufacturing a RF variable capacitor having the above structure.

It is a feature of an embodiment of the present invention to provide a structure of a radio frequency (RF) variable capacitor having a variable range of capacitance between a first minimum value and a first maximum value, the structure including a first capacitor, which has a variable range of capacitance between a second minimum value greater than the first minimum value and a second maximum value greater than the first maximum value, and a second capacitor, which is connected in series to the first capacitor and has a capacitance of a fixed value.

In the structure, the first capacitor may be a MOS capacitor.

According to another feature of an embodiment of the present invention, there is provided a method of manufacturing a radio frequency (RF) variable capacitor having a variable range of capacitance between a first minimum value and a first maximum value, the method including (a) forming a first capacitor, which has a variable range of capacitance between a second minimum value greater than the first minimum value and a second maximum value greater than the first maximum value, using a MOS process, and (b) forming a second capacitor, which is connected in series to the first capacitor formed in step (a) and has a capacitance of a fixed value.

It is preferable that the capacitance of the second capacitor is determined according to a quality factor of the first capacitor and a variable range of capacitance between the second minimum value and the second maximum value.

Also, the second capacitor may be formed of one selected from the group consisting of a metal-insulator-metal (MIM) capacitor, a fractal capacitor and a polystyrene capacitor. The second capacitor may also be formed on a gate electrode of the first capacitor. Alternatively, the second capacitor may be formed on a drain or source electrode of the first capacitor.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
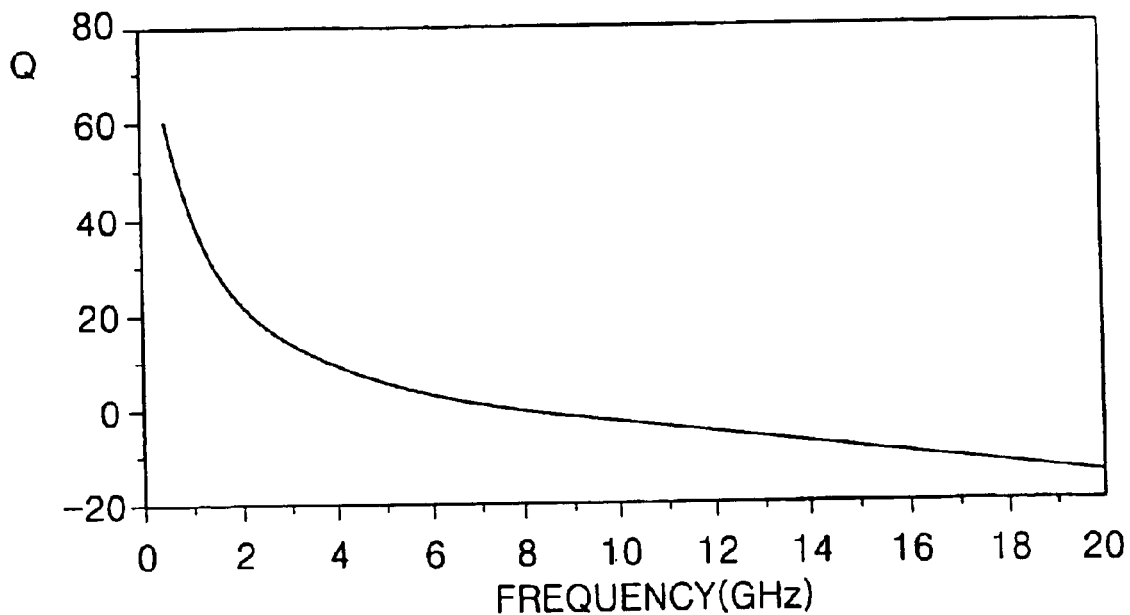
FIG. 1 is a graph of quality factor versus frequency.

Korean Patent Application No. 2002-68574, filed on Nov. 6, 2002, and entitled: "Structure Of Radio Frequency Variable Capacitor And Method Of Manufacturing The Same," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

FIG. 1 is a graph of quality factor versus frequency. Referring to FIG. 1, as frequency increases, a quality factor decreases.

In a capacitor, a quality factor represents a degree of losses of a device and is expressed as an imaginary number part/a real number part of impedance. In this case, the imaginary number part represents capacitance, and the real number part represents resistance. A quality factor at a frequency of over several MHz may be simplified as shown in Equation 1.

$$Q=1/(2\pi f RC) \qquad (1)$$

Here, R represents parasitic resistance in a capacitor, and C represents combination of depletion capacitance and oxide capacitance.

In Equation 1, in order to obtain a high quality factor at a radio frequency (RF) bandwidth, a parasitic resistance component in the capacitor should be reduced.

Figure 2:
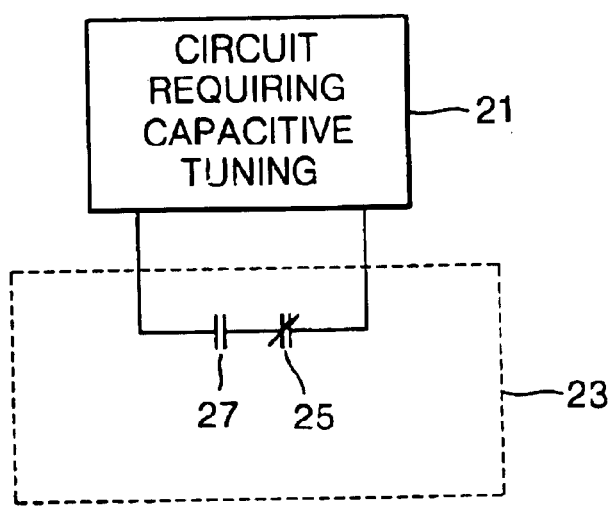
FIG. 2 schematically illustrates a structure of an apparatus to which a radio frequency (RF) variable capacitor is applied, according to the present invention.

FIG. 2 schematically illustrates a structure of an apparatus to which a radio frequency (RF) variable capacitor is applied, according to the present invention. Referring to FIG. 2, the apparatus includes a circuit 21 requiring capacitive tuning and a variable capacitor unit 23. Here, the circuit 21 requiring capacitive tuning includes an RF filter, an amplifier or a voltage controlled oscillator (VCO), not shown. When a variable range of capacitance between a first minimum value $C_{min1}$ and a first maximum value $C_{max1}$ is required, the variable capacitor unit 23 includes a first capacitor 25, which has a variable range of capacitance between a second minimum value $C_{min2}$ greater than the first minimum value $C_{min1}$ and a second maximum value $C_{max2}$ greater than the first maximum value $C_{max1}$, and a second capacitor 27, which is connected in series to the first capacitor 25 and has capacitance of a fixed value $C_{fix}$ determined according to a quality factor of the first capacitor 25 and a variable range of capacitance between the second minimum value and the second maximum value.

The first capacitor 25 may be formed by a CMOS capacitor manufacturing process, and the second capacitor 27 may be formed by a semiconductor manufacturing process, that is, the second capacitor 27 may be formed of one selected from a metal-insulator-metal (MIM) capacitor, a fractal capacitor or a polystyrene capacitor. The MIM, fractal or polystyrene capacitor is linear, has a high quality factor, and is less sensitive to temperature variations.

The second capacitor 27 may also be manufactured by coating an insulating layer on a gate line or a source/drain line extending from a gate electrode or a source/drain electrode of the first capacitor 25, which is a CMOS capacitor, coating a conductive layer, generating a photoresist layer, masking, and etching. Of course, prior to a process of manufacturing the second capacitor 27, a predetermined portion of the gate line or the source/drain line of the first capacitor 25 is metalized with a first metal. Titanium (Ti), platinum (Pt) or silver (Au) may be used as the first metal. Silicon dioxide ($SiO_2$) or silicon nitride (SiN) may be used as the insulating layer, and silver (Au) may be used as the conductive layer.

Capacitance is proportional to the area of two plates forming a capacitor and a dielectric constant of a dielectric body between the two plates, and is in inverse proportion to the interval between the two plates. Thus, desired capacitance of the first and second capacitors 25 and 27 may be obtained by performing a tuning process several times by adopting a method of varying the area of the two plates or the interval between the two plates or varying a dielectric body between the two plates, or experimentally. In order to vary the interval between the two plates or the area of the two plates, a microactuator using an electrostatic power method, a thermal method or an electromagnetic method may be used. In particular, the capacitance of the first capacitor 25 may be increased by increasing an area thereof. In this way, if the area of the first capacitor 25 increases, a number of fingers increases in parallel. As such, gate resistance or source/drain resistance and channel resistance are connected to each other in parallel such that the entire resistance is reduced.

A capacitance of the second capacitor 27 connected in series to the gate electrode or the source/drain electrode of the first capacitor 25 is determined according to a quality factor of the first capacitor 25 and a variable range of capacitance between a second minimum value $C_{min2}$ and a second maximum value $C_{max2}$. In other words, if the quality factor of the first capacitor 25 is high, the area of the first capacitor 25 does not need to be increased. Thus, the second capacitor 27 having a small capacitance is connected to the first capacitor 25. On the other hand, if the quality factor of the first capacitor 25 is low, the area of the first capacitor 25 should be increased. In this case, in order to obtain a first desired minimum value $C_{min1}$ and a first desired maximum value $C_{max1}$, the second capacitor 27 having a large capacitance is connected to the first capacitor 25.

Figure 3:
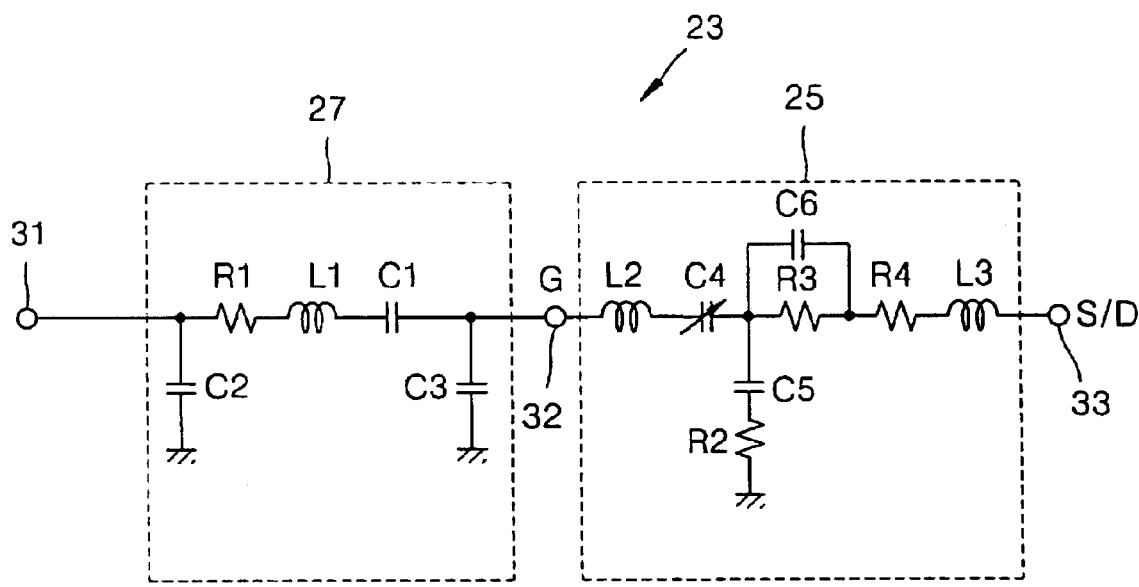
FIG. 3 illustrates an example of an equivalent circuit for a RF variable capacitor shown in FIG. 2, according to the present invention.

FIG. 3 illustrates an example of an equivalent circuit for a RF variable capacitor unit 23 shown in FIG. 2, according to the present invention. The equivalent circuit of the first capacitor 25 and the second capacitor 27 may be variously implemented depending on a peripheral circuit connected to the equivalent circuit. Here, an example in which the second capacitor 27 is connected in series to a gate electrode of the first capacitor 25 is shown in FIG. 3.

Referring to FIG. 3, the first capacitor 25 includes resistors R2, R3, and R4, capacitors C4, C5, and C6, and inductors L2 and L3. The second capacitor 27 includes a resistor R1, capacitors C1, C2, and C3, and an inductor L1. The resistor R1 represents serial parasitic resistance of the second capacitor 27, the capacitor C1 represents substantial capacitance of the second capacitor 27, the capacitors C2 and C3 represent parasitic capacitance of a substrate, and the inductor L1 represents serial parasitic inductance of the second capacitor 27. Meanwhile, the resistor R2 represents parasitic resistance of the substrate, the resistor R3 represents MOS channel resistance, the resistor R4 represents parasitic resistance of a source/drain electrode (S/D) 33, the capacitor C4 represents substantial variable capacitance of the first capacitor 25, the capacitor C5 represents parasitic capacitance of the substrate, the capacitor C6 represents overlap capacitance, the inductor L2 represents parasitic inductance of a gate electrode (G) 32, and the inductor L3 represents parasitic inductance of the source/drain electrode (S/D) 33. Here, reference numerals 31 and 33 respectively denote first and second electrode terminals connected to the circuit 21 requiring capacitive tuning of FIG. 2.

Parasitic resistance and capacitance are factors of adjusting a quality factor of the variable capacitor unit 23 according to the present invention. As seen from the above structure, the first capacitor 25 having a variable range of capacitance between a second minimum value $C_{min2}$ greater than the first desired minimum value $C_{min1}$ and a second maximum value $C_{max2}$ greater than the first desired maximum value $C_{max1}$, or, the capacitor C4, and the second capacitor 27 having capacitance of a predetermined fixed value $C_{fix}$, that is, the capacitor C1, are connected in series to each other such that a variable range of capacitance between a first minimum value $C_{min1}$ and a first maximum value $C_{max1}$ may be obtained.

Meanwhile, the resistors R3 and R4 of the first capacitor 25 correspond to a parasitic resistance component, and the resistor R1 of the second capacitor 27 corresponds to a parasitic resistance component. The parasitic resistance component of the second capacitor 27 is much smaller than the parasitic resistance component of the first capacitor 25, and thus may be ignored. Therefore, only the parasitic resistance component of the first capacitor 25 may be considered. Capacitance of the first capacitor 25 having the variable range of capacitance between the second minimum value $C_{min2}$ and the second maximum value $C_{max2}$ increases while a resistance component is reduced to be proportional to the number of fingers. Whereas a case where a single variable capacitor is designed to have a variable range of capacitance between a first minimum value $C_{min1}$ smaller than the second minimum value $C_{min2}$ and a first maximum value $C_{max1}$ smaller than the second maximum value $C_{max2}$. Thus, the resistors R3 and R4, which are parasitic resistance components of the first capacitor 25, are reduced compared to a case where the single variable capacitor is used.

In other words, if the first capacitor 25 which is a variable capacitor, is connected in series to the second capacitor 27, which is a fixed capacitor, the entire parasitic resistance component is reduced, and thus, a quality factor increases.

Figure 4:
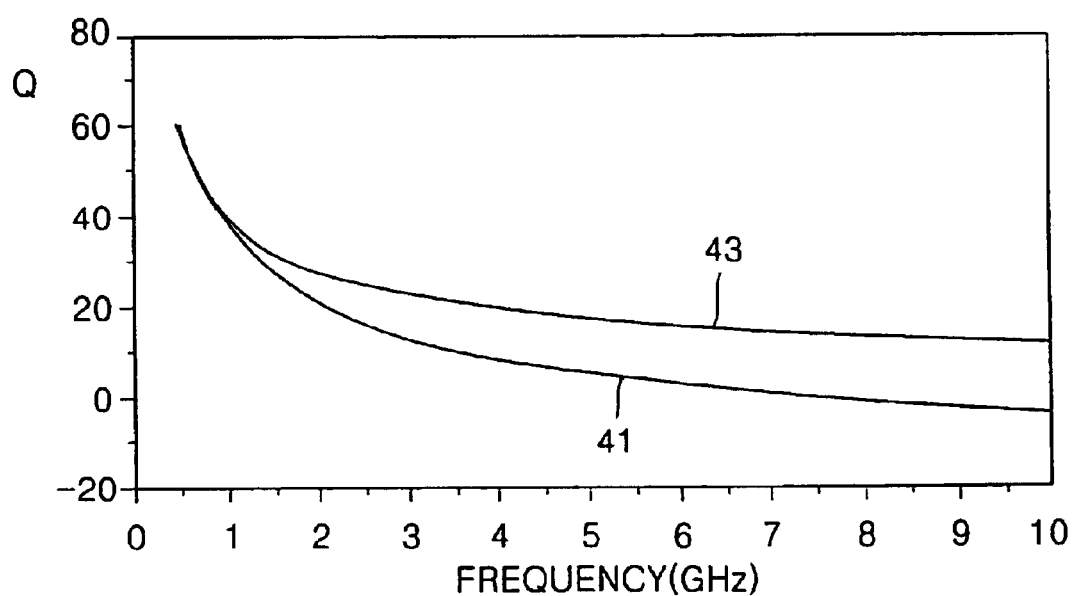
FIG. 4 is a graph of quality factor versus frequency for a variable capacitor according to the present invention and a prior-art variable capacitor, respectively.

FIG. 4 is a graph of quality factor versus frequency for a variable capacitor according to the present invention and a prior-art variable capacitor, respectively. Data line 41 represents a prior-art single variable capacitor, and data line 43 represents a variable capacitor according to the present invention. Referring to FIG. 4, in the variable capacitor according to the present invention, a quality factor is increased by about three times that of the prior-art single variable capacitor.

Figure 5A:
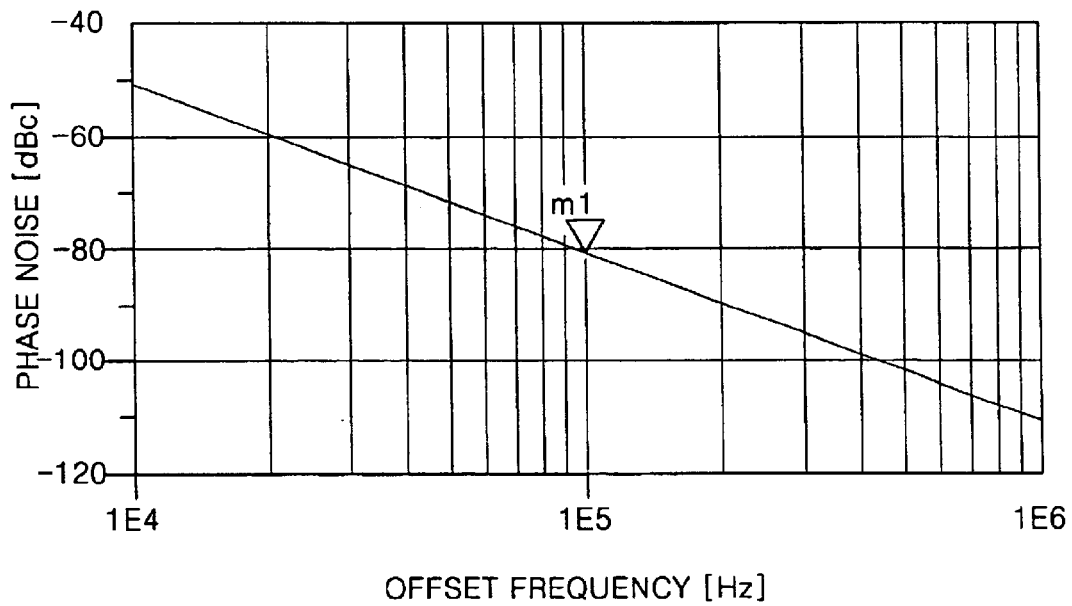
FIGS. 5A and 5B are graphs of phase noise versus offset frequency in a case that a variable capacitor according to the present invention and a prior-art variable capacitor are applied to a VCO, respectively.
Figure 5B:
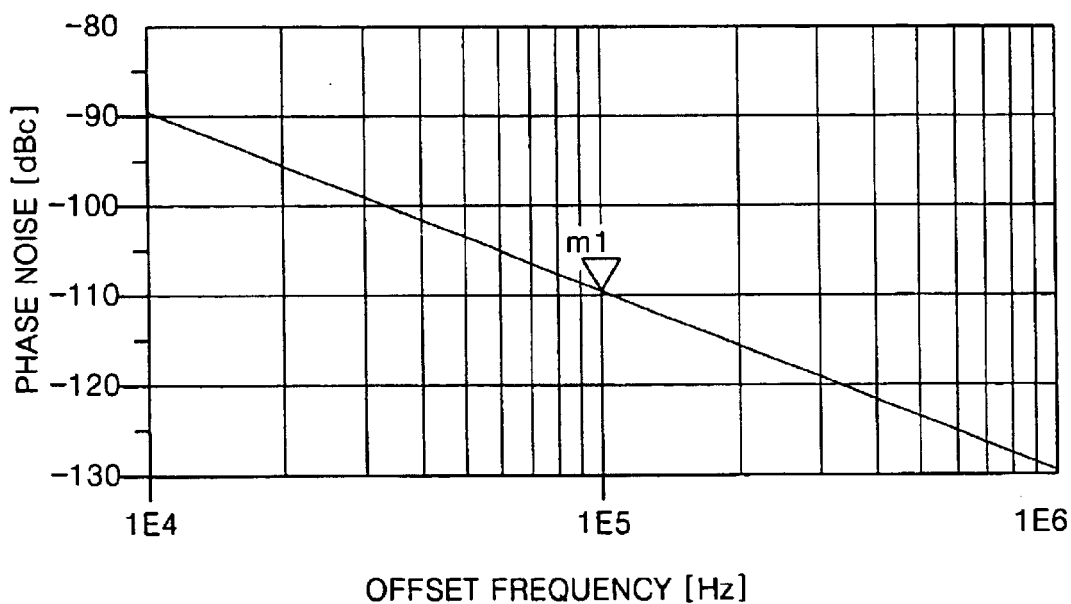

FIGS. 5A and 5B are graphs of phase noise versus offset frequency in a case that a variable capacitor according to the present invention and a prior-art variable capacitor are applied to a VCO, respectively. The phase noise is −80.64 dBc in FIG. 5A and −109.6 dBc in FIG. 5B, at an offset frequency 100 kHz. In a VCO using the variable capacitor according to the present invention, the phase noise is improved by about 30 dBc compared to that of a VCO using the prior-art single variable capacitor in FIG. 5B.

In this manner, a low quality factor of a variable capacitor occurring at an RF bandwidth is improved, and thus, transconductance of an active element forming a negative resistance is reduced. As such, phase noise of a VCO caused by thermal noise may be reduced, as may power consumption taken by the VCO in a RF transceiver.

As described above, in the structure of the variable capacitor according to the present invention, a parasitic resistance component is reduced such that a quality factor is increased and phase noise and power consumption of a circuit requiring capacitive tuning using the structure of the variable capacitor may be reduced. In addition, the variable capacitor is manufactured using a CMOS process such that it is easy to make the variable capacitor as one chip having another CMOS circuit.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A structure of a radio frequency (RF) variable capacitor having a variable range of capacitance between a first minimum value and a first maximum value, the structure comprising:

a first capacitor, which has a variable range of capacitance between a second minimum value greater than the first minimum value and a second maximum value greater than the first maximum value; and a second capacitor, which is connected in series to the first capacitor and has a capacitance of a fixed value.

2. The structure as claimed in claim 1, wherein the capacitance the second capacitor is determined according to a quality factor of the first capacitor and a variable range of capacitance between the second minimum value and the second maximum value.

3. The structure as claimed in claim 1, wherein the first capacitor includes a MOS capacitor.

4. The structure as claimed in claim 1, wherein the second capacitor is formed of one selected from the group consisting of a metal-insulator-metal (MIM) capacitor, a fractal capacitor and a polystyrene capacitor.

5. The structure as claimed in claim 1, wherein the second capacitor is formed on a gate electrode of the first capacitor.

6. The structure as claimed in claim 1, wherein the second capacitor is formed on a drain or source electrode of the first capacitor.

7. A method of manufacturing a radio frequency (RF) variable capacitor having a variable range of capacitance between a first minimum value and a first maximum value, the method comprising:

(a) forming a first capacitor, which has a variable range of capacitance between a second minimum value greater than the first minimum value and a second maximum value greater than the first maximum value, using a MOS process; and (b) forming a second capacitor, which is connected in series to the first capacitor formed in step (a) and has a capacitance of a fixed value.

8. The method as claimed in claim 7, wherein the capacitance of the second capacitor is determined according to a quality factor of the first capacitor and a variable range of capacitance between the second minimum value and the second maximum value.

9. The method as claimed in claim 7, wherein the second capacitor is formed of one selected from the group consisting of a metal-insulator-metal (MIM) capacitor, a fractal capacitor and a polystyrene capacitor.

10. The method as claimed in claim 7, wherein the second capacitor is formed on a gate electrode of the first capacitor.

11. The method as claimed in claim 7, wherein the second capacitor is formed on a drain or source electrode of the first capacitor.

* * * * *